(12) United States Patent
Bao

(10) Patent No.: US 10,622,579 B2
(45) Date of Patent: Apr. 14, 2020

(54) ORGANIC LIGHT-EMITTING DIODE (OLED) DISPLAY PANEL, BACKPLANE ATTACHING METHOD AND BACKPLANE ATTACHING DEVICE

(71) Applicant: WUHAN CHINA STAR OPTOELECTRONICS SEMICONDUCTOR DISPLAY TECHNOLOGY CO., LTD., Wuhan, Hubei (CN)

(72) Inventor: Panfei Bao, Hubei (CN)

(73) Assignee: WUHAN CHINA STAR OPTOELECTRONICS SEMICONDUCTOR DISPLAY TECHNOLOGY CO., LTD., Wuhan, Hubei (CN)

( * ) Notice: Subject to any disclaimer, the term of this patent is extended or adjusted under 35 U.S.C. 154(b) by 2 days.

(21) Appl. No.: 16/092,215

(22) PCT Filed: Aug. 10, 2018

(86) PCT No.: PCT/CN2018/099775
§ 371 (c)(1),
(2) Date: Oct. 9, 2018

(87) PCT Pub. No.: WO2019/223125
PCT Pub. Date: Nov. 28, 2019

(65) Prior Publication Data
US 2019/0363282 A1      Nov. 28, 2019

(51) Int. Cl.
*H01L 51/52* (2006.01)
*H01L 27/32* (2006.01)
(Continued)

(52) U.S. Cl.
CPC ...... *H01L 51/5237* (2013.01); *H01L 27/3244* (2013.01); *H01L 51/0097* (2013.01); *H01L 51/56* (2013.01); *H01L 2251/5338* (2013.01)

(58) Field of Classification Search
CPC ............. H01L 51/5237; H01L 27/3244; H01L 51/0097; H01L 51/56; H01L 2251/5338; H01L 51/5246
See application file for complete search history.

(56) References Cited

U.S. PATENT DOCUMENTS

| 2007/0148337 A1* | 6/2007 | Nichols ................. C23C 14/042 427/98.4 |
| 2013/0095592 A1* | 4/2013 | Koresawa ............. H01L 51/003 438/46 |

(Continued)

FOREIGN PATENT DOCUMENTS

| WO | WO-2015109713 A1 * | 7/2015 | |
| WO | WO-2019114072 A1 * | 6/2019 | ........... H01L 51/003 |

*Primary Examiner* — Earl N Taylor
(74) *Attorney, Agent, or Firm* — Mark M. Friedman

(57) ABSTRACT

An organic lighting-emitting diode (OLED) display panel, a backplane attaching method and a backplane attaching device are provided. The OLED display panel includes: a flexible substrate, and a thin film transistor layer and a light-emitting layer prepared on the flexible substrate. The flexible substrate includes a first flexible substrate layer, a fixing layer and a second flexible substrate layer sequentially stacked one another. The fixing layer includes an organic film layer and magnetic particles embedded in the organic film layer. The magnetic particles are located in an internal of the flexible substrate.

13 Claims, 4 Drawing Sheets

(51) Int. Cl.
*H01L 51/56* (2006.01)
*H01L 51/00* (2006.01)

(56) References Cited

U.S. PATENT DOCUMENTS

2018/0123059 A1* 5/2018 Yang .................. H01L 51/56
2019/0187752 A1* 6/2019 Lee .................... G06F 1/1641

* cited by examiner

ORGANIC LIGHT-EMITTING DIODE (OLED) DISPLAY PANEL, BACKPLANE ATTACHING METHOD AND BACKPLANE ATTACHING DEVICE

FIELD OF INVENTION

The present invention relates to display panel manufacturing fields, especially to an Organic light-emitting diode (OLED) display panel, a backplane attaching method and a backplane attaching device.

BACKGROUND OF INVENTION

Organic light-emitting diode (OLED) has various advantages such as flexibility, pliability, active illumination, fast response, high contrast, progressively replace liquid crystal displays (LCDs), and become the most potential displays of a next generation. During manufacture of OLED panels, the yield and efficiency of module sites have an important impact on the quality and mass production rate of the OLED panel.

In the current module process, backplane lamination (BP Lami) is one of the important process points. The backplane mainly provides a certain support for the entire OLED panel. However, for the current technology, the main issue is the bubble problem in the backplane attachment process on the side of the OLED panel binding area. With reference to FIG. 1, in the OLED panel manufacturing process, since a height difference h exists between a side portion of the OLED panel bound with the chip on the surface of the chip 11 (Chip On FPC, COF) and the entire OLED panel, the roller 14 cannot roll to a corresponding position of a corresponding binding area 12 during the attachment of the backplane 15, otherwise it will cause the OLED panel corresponding to the binding area 12 to be broken, thereby causing damage to the OLED panel. If the roller 14 does not roll to the corresponding position of the binding area 12, it will cause the backplane 15 to generate bubbles 13 when attached to the binding area 12, and the presence of the bubbles 13 will affect the efficiency of the entire manufacturing process and yield. Secondly, due to the presence of the glue 10 above the binding area 12 of the OLED panel, the surface of the OLED panel at the binding area 12 is uneven, so it is difficult to solve the issue by fixtures.

Therefore, it is necessary to provide a backplane attaching method and a backplane attaching device for an OLED display panel to solve the existing issues of the prior art.

SUMMARY OF INVENTION

The present invention provides an Organic light-emitting diode (OLED) display panel, a backplane attaching method and a backplane attaching device that are able to smoothly attach a backplane to a flexible substrate, avoid bubbles between the backplane and the flexible substrate and prevent damages to the OLED display panel.

To solve the above issue, technical solution provided by the present invention are as follows:

The present invention provides an OLED display panel comprising:

a flexible substrate, and the flexible substrate comprising a cutting region for a later cutting process;

a thin film transistor layer disposed on the flexible substrate;

a light-emitting layer disposed on the thin film transistor layer;

the flexible substrate comprising a first flexible substrate layer, a fixing layer and a second flexible substrate layer that are sequentially stacked one another, and the thin film transistor layer located on the second flexible substrate layer;

wherein the fixing layer comprises an organic film layer and magnetic particles embedded in the organic film layer, a diameter of the magnetic particles is less than a thickness of the flexible substrate, and the magnetic particles are located in an internal of the flexible substrate.

According to a preferred embodiment of the present invention, a portion of the fixing layer corresponding to the cutting region is the organic film layer, and a rest portion of the fixing layer comprises the organic film layer and the magnetic particles embedded in the organic film layer.

According to a preferred embodiment of the present invention, except for the cutting region, the magnetic particles are distributed evenly and adjacent two of the magnetic particles are at an interval.

According to a preferred embodiment of the present invention, the intervals among the magnetic particles are the same.

According to a preferred embodiment of the present invention, material of the organic film layer is the same as material of the flexible substrate.

According to a preferred embodiment of the present invention, the magnetic particles penetrate the organic film layer, and two portions of magnetic particles exposed out of two surfaces of the organic film layer are embedded in the first flexible substrate layer and the second flexible substrate layer respectively.

The present invention also provides a backplane attaching device applied to an Organic light-emitting diode (OLED) display panel, and comprising:

a roller configured to roll and laminate the OLED display panel and a backplane attached to a surface of a flexible substrate of the OLED display panel;

a supporting bar, and one of two ends of the supporting bar movably connected to an end portion of the roller and configured to provide the roller with supporting force;

a moving track paralleling the OLED display panel and disposed along a laminating direction of the roller, and the other end of the supporting bar movably disposed on the moving track;

the flexible substrate of the OLED display panel comprising a fixing layer embedded with magnetic particles, and the magnetic particles located in an internal of the flexible substrate;

wherein the roller and the magnetic particles are attractive to each other, and the roller keeps a same height when moving along the moving track.

According to a preferred embodiment of the present invention, the supporting bar is two and the moving track is two, the two supporting bars are connected to and correspond to two ends of the roller respectively, one end of each supporting bar is movably connected a corresponding end of the roller and the other end of each supporting bar is movably disposed on one of the moving tracks disposed perpendicular to an axial direction of the roller.

According to a preferred embodiment of the present invention, the backplane attaching device further comprises a control terminal, and the control terminal is configured to control a moving speed of the supporting bar on the moving track.

According to a preferred embodiment of the present invention, a force between the roller and each of the magnetic particles is greater than a force between adjacent two of the magnetic particles.

The present invention also provides a backplane attaching method, applied to an organic lighting-emitting diode (OLED) display panel, wherein the backplane attaching method comprises:

step S10, comprising providing an OLED display panel, wherein a flexible substrate of the OLED display panel comprises a fixing layer embedded with magnetic particles, and the magnetic particles are located in an internal of the flexible substrate;

step S20, comprising disposing a backplane on the flexible substrate of the OLED display panel;

step S30, comprising attaching a roller of a backplane attaching device to the backplane, and rolling the roller from a side edge of the backplane to another side edge of the backplane to tightly laminate the backplane with the flexible substrate;

wherein the roller and the magnetic particles are attractive to each other.

According to a preferred embodiment of the present invention, the backplane attaching device further comprises a supporting bar configured to support the roller, and a moving track, one of two ends of the supporting bar is movably connected to the roller, the other end of the supporting bar is movably disposed on the moving track, the supporting bar drives the roller to move on the moving track to tightly press and fit the backplane with the flexible substrate.

According to a preferred embodiment of the present invention, after the step S20, the attaching method further comprises:

step S201, comprising forming a protective film on a surface of the backplane to protect the backplane during the backplane attaching method;

the step S30 further comprises:

step S301, comprising stripping off the protective film.

Advantages of the present invention are as follows. The OLED display panel of the present invention, the backplane attaching method and the backplane attaching device, by additionally disposing a fixing layer embedded with magnetic particles in the flexible substrate of the OLED display panel and designing the roller of the backplane attaching device to have material that is attractive to the magnetic particles, makes the flexible substrate tightly laminate the backplane through the attractive force between the magnetic particles and the roller, and avoids bubbles. Because such attaching method prevents to exert larger pressure on one side of the OLED display panel, damage to the OLED display panel due to the height difference between the binding area of the OLED display panel and the entire panel is avoided. Furthermore, the magnetic particles are disposed around cutting grooves and therefore would not influence the cutting process of the OLED display panel. Moreover, the magnetic particles located in the internal of the flexible substrate would not influence circuits of an array substrate and later stripping of a glass substrate. Because the roller is connected to the supporting bar, height and moving speed of the roller is easy to control when the attaching process is implemented. Secondly, because the supporting bar moves on the moving track, stability of the rolling roller can be further assured.

DESCRIPTION OF DRAWINGS

To more clearly elaborate on the technical solutions of embodiments of the present invention or prior art, appended figures necessary for describing the embodiments of the present invention or prior art will be briefly introduced as follows. Apparently, the following appended figures are merely some embodiments of the present invention. A person of ordinary skill in the art may acquire other figures according to the appended figures without any creative effort.

DETAILED DESCRIPTION OF PREFERRED EMBODIMENTS

Figure 1:
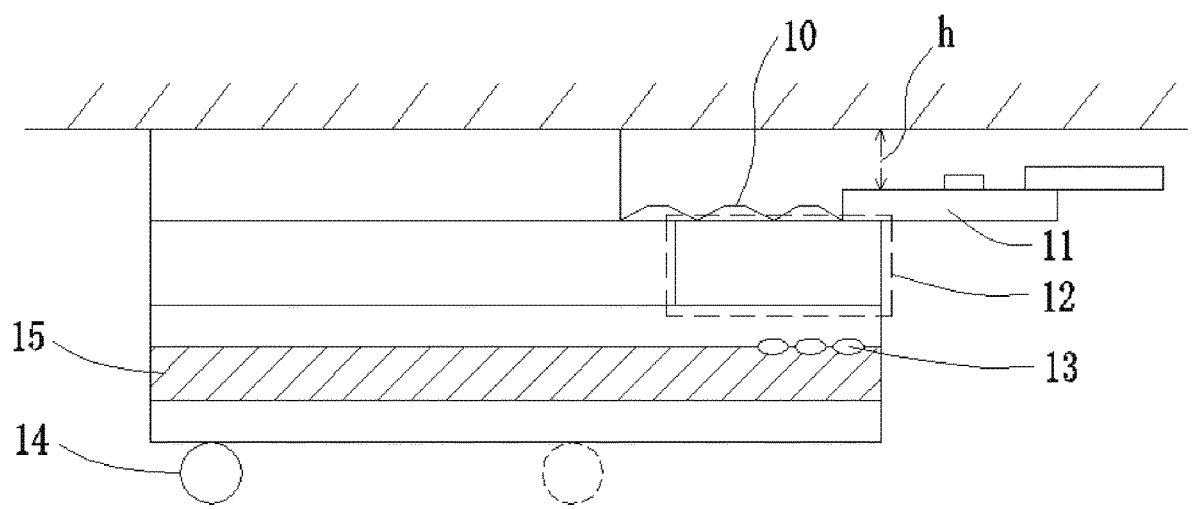
FIG. 1 is a schematic view of a conventional backplane attached to an organic lighting-emitting diode (OLED) display panel in accordance with the prior art.

Each of the following embodiments is described with appending figures to illustrate specific embodiments of the present invention that are applicable. The terminologies of direction mentioned in the present invention, such as "upper", "lower", "front", "rear", "left", "right", "inner", "outer", "side surface" and etc., only refer to the directions of the appended figures. Therefore, the terminologies of direction are used for explanation and comprehension of the present invention, instead of limiting the present invention. In the figures, units with similar structures are marked with the same reference numerals.

The present invention aims at the technical issue of conventional backplane attaching methods and conventional backplane attaching devices of organic light-emitting diode (OLED) display panels easily causing damages to the OLED display panel because bubbles easily occur when the backplane is attached such that the product performance and yield are affected. The present embodiment is able to solve the above issue.

Figure 2:
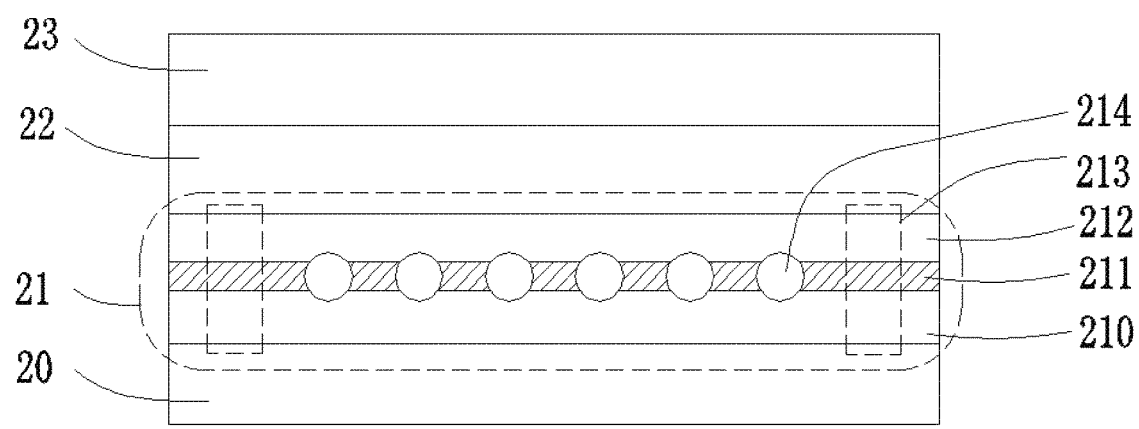
FIG. 2 is a schematic structural view of the OLED display panel of an embodiment of the present invention.

With reference to FIG. 2, FIG. 2 is a schematic structural view of the OLED display panel of an embodiment of the present invention. The OLED display panel comprises: a glass substrate 20; a flexible substrate 21, prepared on the glass substrate 20; a thin film transistor layer 22, prepared on the flexible substrate 21; a light-emitting layer 23, prepared on the thin film transistor layer 22; wherein the flexible substrate 21 comprises a first flexible substrate layer 210, a fixing layer 211 and a second flexible substrate layer 212 that are sequentially stacked one another, and the thin film transistor layer 22 is located on the second flexible substrate layer 212. The fixing layer 211 can be made of organic material, for example, the material of the fixing layer 211 can be the same as material of the first flexible substrate layer 210 and the second flexible substrate layer 212. A main body of the fixing layer 211 is an organic film layer. The fixing layer 211 further comprises magnetic particles 214 embedded in the organic film layer. The magnetic particles 214 can be magnets. The magnetic particles 214 provided by the present embodiment can be spherical but are not limited thereto. A diameter of each of the magnetic particles 214 is less or far less than a thickness of the flexible substrate 21, and the magnetic particles 214 are located in an internal of the flexible substrate 21 without protruding out of two surfaces of the flexible substrate 21 to avoid influence to circuits of an array substrate and a later stripping process of a glass substrate.

The flexible substrate 21 comprises a cutting region 213 for implementing a later cutting process to the OLED display panel. A portion of the fixing layer 211 corresponding to the cutting region 213 only includes the organic film layer, and a rest portion of the fixing layer 211 includes the organic film layer and the magnetic particles 214 embedded in the organic film layer. The magnetic particles 214 are disposed around the cutting region 213 of the OLED display panel to prevent the magnetic particles 214 from affecting the cutting process. Except for the cutting region 213, the magnetic particles 214 are distributed evenly in the organic film layer or distributed unevenly according to actual circumstances. Preferably, except for the cutting region 213, the magnetic particles 214 are distributed evenly, and adjacent two of the magnetic particles 214 are at an interval. Preferably, the intervals among the magnetic particles 214 are the same. Such configuration not only prevents the magnetic particles 214 from affecting the cutting process, but also ensures flexibility of the flexible substrate 21 because of even distribution of the magnetic particles 214. Furthermore, because the magnetic particles 214 are distributed at the same intervals, magnetic force is evenly distributed on a surface of the flexible substrate 21, which assures better attachment of the backplane.

In the preparation process of the OLED display panel, the first flexible substrate layer 210 is coated on the glass substrate 20 first. Then the fixing layer 211 is disposed on the coated first flexible substrate layer 210. Then the second flexible substrate layer 212 is coated, and the whole flexible substrate 21 is cured. wherein the magnetic particles 214 penetrate the organic film layer, and two portions of the magnetic particles 214 exposed out of two surfaces of the organic film layer are embedded in the first flexible substrate layer 210 and the second flexible substrate layer 212 to increase contact area between the fixing layer 211 and the first flexible substrate layer 210 and the second flexible substrate layer 212 for tight connection.

Furthermore, by selection of material of the magnetic particles 214 for interval setting of the magnetic particles 24, forces among the magnetic particles 214 can be decreased or offset, which facilitates preparation of the fixing layer 211.

Moreover, the OLED display panel also comprises film layers or devices (not shown), for example, common devices such as a thin film package layer and a polarizer.

Figure 3A:
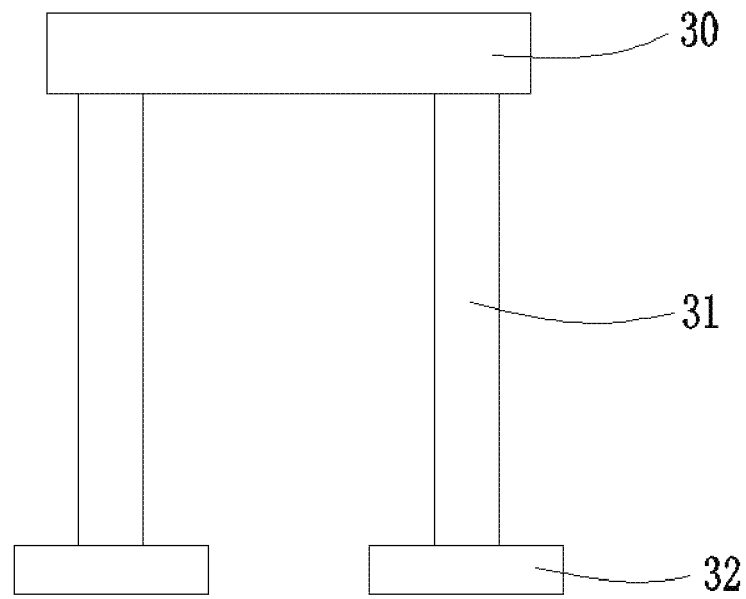
FIGS. 3A to 3B are schematic structural views of a backplane attaching device of the embodiment of the present invention.
Figure 3B:
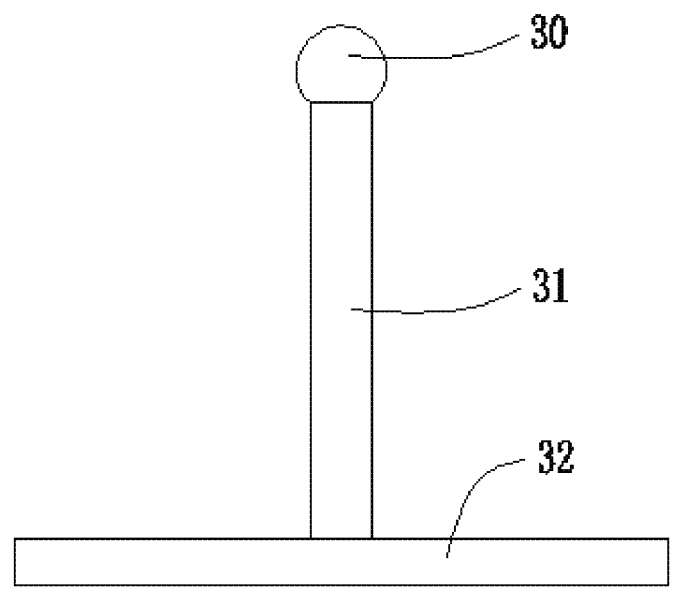

With reference to FIGS. 3A to 3B, FIGS. 3A to 3B are schematic structural views of a backplane attaching device of the embodiment of the present invention. The backplane attaching device is applied to the OLED display panel, and comprises: a roller 30 configured to roll and laminate the OLED display panel and a backplane attached to a surface of a flexible substrate of the OLED display panel; a supporting bar 31, and one of two ends of the supporting bar 31 movably connected to an end portion of the roller 30 and configured to provide the roller 30 with supporting force; a moving track 32 paralleling the OLED display panel and disposed along a laminating direction of the roller 30, and the other end of the supporting bar 31 movably disposed on the moving track 32. As shown in the figures, the supporting bar 31 is two and the moving track 32 is two, the two supporting bars 31 are connected to and correspond to two ends of the roller 30 respectively, one end of each supporting bar 31 is movably connected a corresponding end of the roller 30 and the other end of each supporting bar 31 is movably disposed on one of the moving tracks 32 disposed perpendicular to an axial direction of the roller 30. The roller 30 is made of material that is attractive to the magnetic particles in the fixing layer, for example, Fe.

Alternatively, only one supporting bar 31 is employed. One end of the supporting bar 31 is movably connected to one end of the roller 30, the other end of the supporting bar 31 is movably is disposed on the moving track 32. Of course, a number of the supporting bar 31, a number of the moving track 32 and the way of connection are not limited. Because the roller 30 is supported by the supporting bar 31 and moves on the moving track 32, the roller 30 can be assured to roll and move on the same level, which ensures stability of the rolling roller 30. The backplane attaching device further comprises a control terminal. The control terminal is configured to control a moving speed of the supporting bar 31 on the moving track 32.

Figure 5:
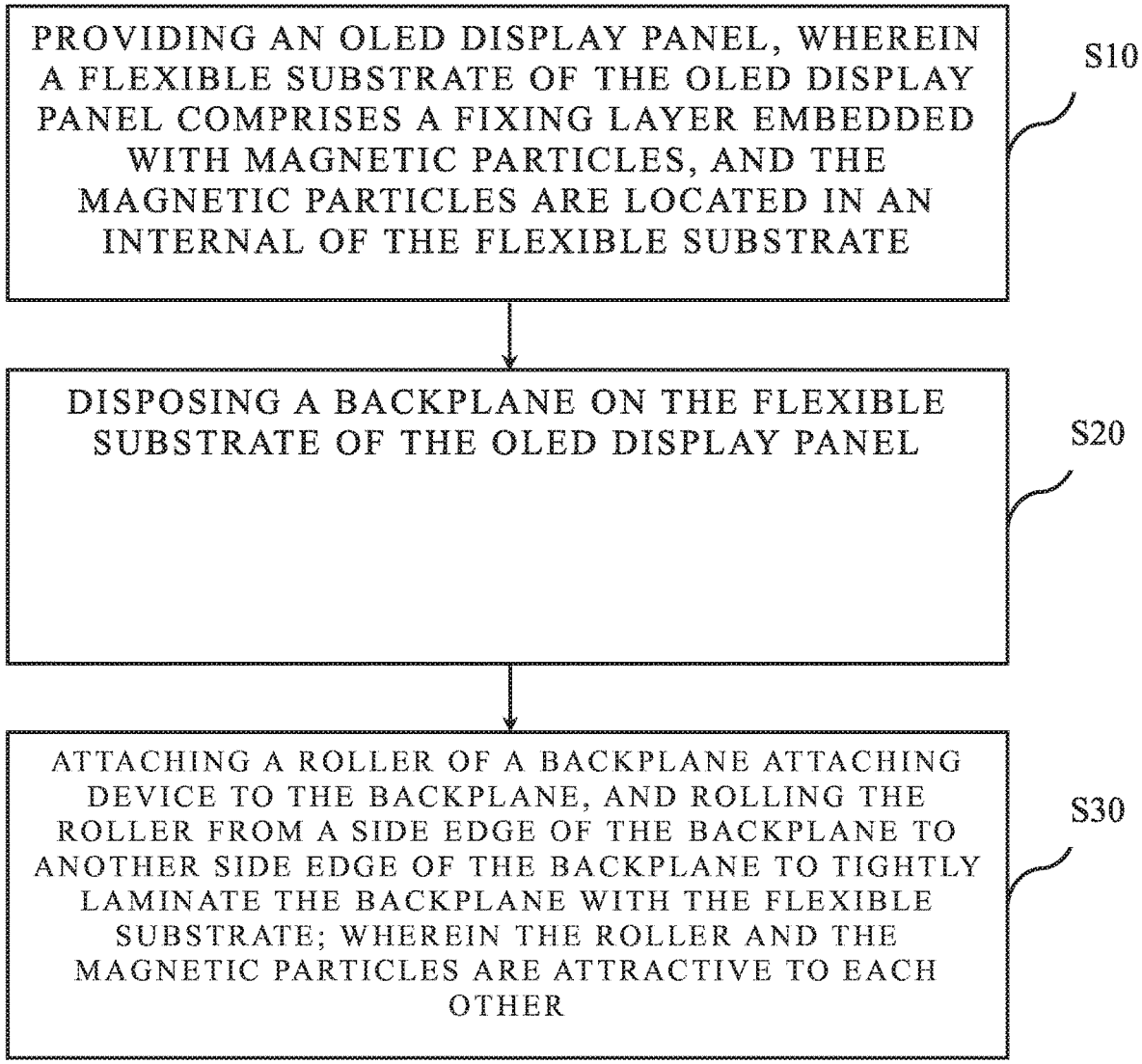
FIG. 5 is a schematic flowchart of a backplane attaching method of the embodiment of the present invention.

The present invention also provides a backplane attaching method applied to an OLED display panel, as shown in FIG. 5. The backplane attaching method comprises steps S10, S20, S30.

The step S10 comprises providing an OLED display panel, wherein a flexible substrate of the OLED display panel comprises a fixing layer embedded with magnetic particles, and the magnetic particles are located in an internal of the flexible substrate.

Figure 4:
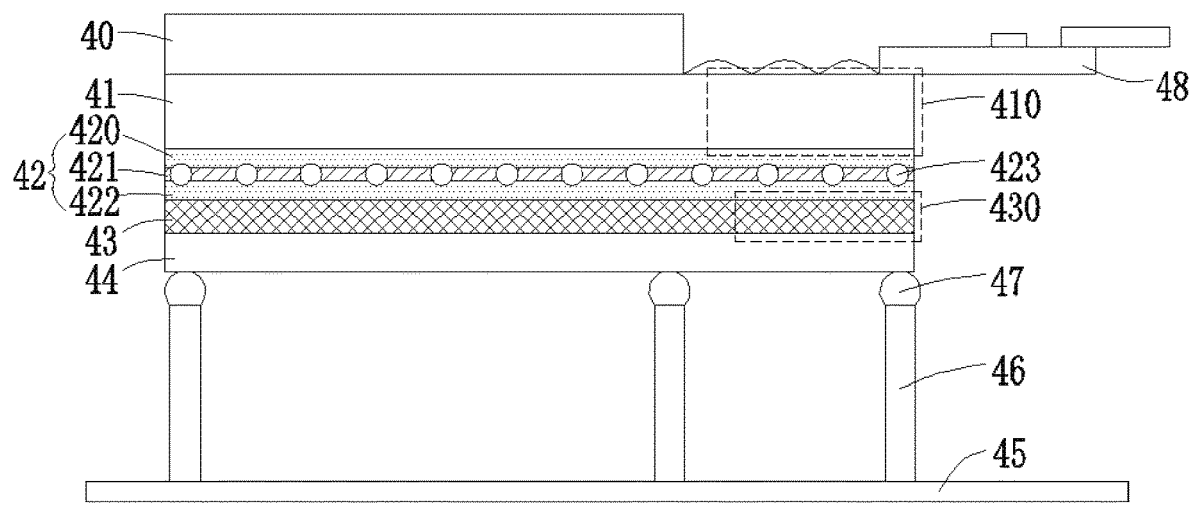
FIG. 4 is a schematic view of the backplane attached to the OLED display panel of the embodiment of the present invention.

Specifically, with reference to FIG. 4, the OLED display panel comprises a flexible substrate 42, a thin film transistor layer and a light-emitting layer that are sequentially stacked one another, and a composite film layer 41 composed of thin film package layers, a polarizer 40, and a chip-on-film 48 bounded on a binding area 410 of the composite film layer 41. The flexible substrate 42 comprises a first flexible substrate layer 422, a fixing layer 421 and a second flexible substrate layer 420. Magnetic particles 423 are embedded in the fixing layer 421. The magnetic particles 423 are located in an internal of the flexible substrate 42. Furthermore, according to different types and structures of OLED display panels, other film layers such as touch layers can be included and will not be limited herein.

When the OLED display panel is prepared, a glass substrate generally serves as a supporting base, which requires stripping off the glass substrate before the backplane is attached. The stripping method is the same as a conventional method and will not be described repetitively herein.

The step S20 comprises disposing a backplane on the flexible substrate of the OLED display panel.

Specifically, after the glass substrate is stripped off, a backplane 43 is dispose on a stripped surface of the flexible substrate 42. Usually, to protect the backplane 43 from damages during the attaching process, a protective film 44 can be formed on a surface of the backplane 43 to protect the backplane 43.

The step S30 comprises attaching a roller of a backplane attaching device to the backplane, and rolling the roller from a side edge of the backplane to another side edge of the backplane to tightly laminate the backplane with the flexible substrate; wherein the roller and the magnetic particles are attractive to each other.

Specifically, the backplane attaching device comprises: a roller 47, a supporting bar 46configured to support the roller 47, and a moving track 45. One of two ends of the supporting bar 46 is movably connected to the roller 47, and the other end is movably disposed on the moving track 45. Specific structures refer to the above embodiment. Because the roller 47 and the magnetic particles 423 are attractive material, the roller 47 and the magnetic particles 423 are attractive to each other, and the roller 47 can be attracted and attached to a surface of the protective film 44. The flexible substrate 42 tightly laminates the backplane 43 through attractive force between the magnetic particles 423 and the roller 47. The roller 47 rolls and presses from a side edge of the backplane 43 to another side edge of the backplane 43 to avoid bubbles. Especially, the roller 47 can rolls to a first region 430 of the backplane 43 corresponding to one side of the binding area 410. Therefore, no bubble is generated in the first region 430 of the backplane 43. Such attaching method does not exert excessive pressure on one side of the OLED display panel, but implement the lamination through attractive force between the magnetic particles 423 and the roller 47, which prevents damages of the OLED display panel caused by a height difference between the binding area 410 and the entire OLED display panel.

Because the roller 47 is connected to the supporting bar 46, height and moving speed of the roller 47 is easy to control when the attaching process is implemented. The roller 47 moving along the moving track 45 keeps the same height. Secondly, because the supporting bar 46 moves on the moving track 45, stability of the rolling roller 47 can be further assured.

If a protective film 44 is disposed on the backplane 43, after the step S30, the protective film 44 is stripped off to accomplish the attaching process.

Furthermore, the force between the roller 47 and the magnetic particles 423 is larger than force between adjacent two of the magnetic particles 423. The above structures can be achieved according to selection of material of the roller 47 and the magnetic particles 423 and setting of relative area.

Although the preferred embodiments of the present invention have been disclosed as above, the aforementioned preferred embodiments are not used to limit the present invention. The person of ordinary skill in the art may make various of changes and modifications without departing from the spirit and scope of the present invention. Therefore, the scope of protection of the present invention is defined by the scope of the claims.

What is claimed is:
1. An Organic light-emitting diode (OLED) display panel, comprising:
a flexible substrate, and the flexible substrate comprising a cutting region for a later cutting process;
a thin film transistor layer disposed on the flexible substrate;
a light-emitting layer disposed on the thin film transistor layer;
the flexible substrate comprising a first flexible substrate layer, a fixing layer and a second flexible substrate layer that are sequentially stacked one another, and the thin film transistor layer located on the second flexible substrate layer;
wherein the fixing layer comprises an organic film layer and magnetic particles embedded in the organic film layer, a diameter of the magnetic particles is less than a thickness of the flexible substrate, and the magnetic particles are located in an internal of the flexible substrate.

2. The OLED display panel as claimed in claim 1, wherein a portion of the fixing layer corresponding to the cutting region is the organic film layer, and a rest portion of the fixing layer comprises the organic film layer and the magnetic particles embedded in the organic film layer.

3. The OLED display panel as claimed in claim 2, wherein except for the cutting region, the magnetic particles are distributed evenly and adjacent two of the magnetic particles are at an interval.

4. The OLED display panel as claimed in claim 3, wherein the intervals among the magnetic particles are the same.

5. The OLED display panel as claimed in claim 1, wherein material of the organic film layer is the same as material of the flexible substrate.

6. The OLED display panel as claimed in claim 1, wherein the magnetic particles penetrate the organic film layer, and two portions of magnetic particles exposed out of two surfaces of the organic film layer are embedded in the first flexible substrate layer and the second flexible substrate layer respectively.

7. A backplane attaching device, applied to an Organic light-emitting diode (OLED) display panel, and comprising:
a roller configured to roll and laminate the OLED display panel and a backplane attached to a surface of a flexible substrate of the OLED display panel;
a supporting bar, and one of two ends of the supporting bar movably connected to an end portion of the roller and configured to provide the roller with supporting force;
a moving track paralleling the OLED display panel and disposed along a laminating direction of the roller, and the other end of the supporting bar movably disposed on the moving track;
the flexible substrate of the OLED display panel comprising a fixing layer embedded with magnetic particles, and the magnetic particles located in an internal of the flexible substrate;
wherein the roller and the magnetic particles are attractive to each other, and the roller keeps a same height when moving along the moving track.

8. The backplane attaching device as claimed in claim 7, wherein the supporting bar is two and the moving track is two, the two supporting bars are connected to and correspond to two ends of the roller respectively, one end of each supporting bar is movably connected a corresponding end of the roller and the other end of each supporting bar is movably disposed on one of the moving tracks disposed perpendicular to an axial direction of the roller.

9. The backplane attaching device as claimed in claim 7, wherein the backplane attaching device further comprises a control terminal, and the control terminal is configured to control a moving speed of the supporting bar on the moving track.

10. The backplane attaching device as claimed in claim 7, wherein a force between the roller and each of the magnetic particles is greater than a force between adjacent two of the magnetic particles.

11. A backplane attaching method, applied to an Organic light-emitting diode (OLED) display panel, wherein the backplane attaching method comprises:
step S10, comprising providing an OLED display panel, wherein a flexible substrate of the OLED display panel comprises a fixing layer embedded with magnetic particles, and the magnetic particles are located in an internal of the flexible substrate;
step S20, comprising disposing a backplane on the flexible substrate of the OLED display panel;
step S30, comprising attaching a roller of a backplane attaching device to the backplane, and rolling the roller from a side edge of the backplane to another side edge of the backplane to tightly laminate the backplane with the flexible substrate;

wherein the roller and the magnetic particles are attractive to each other.

12. The backplane attaching method as claimed in claim 11, wherein the backplane attaching device further comprises a supporting bar configured to support the roller, and a moving track, one of two ends of the supporting bar is movably connected to the roller, the other end of the supporting bar is movably disposed on the moving track, the supporting bar drives the roller to move on the moving track to tightly press and fit the backplane with the flexible substrate.

13. The backplane attaching method as claimed in claim 11, wherein after the step S20, the attaching method further comprises:

step S201, comprising forming a protective film on a surface of the backplane to protect the backplane during the backplane attaching method;

the step S30 further comprises:

step S301, comprising stripping off the protective film.

* * * * *

UNITED STATES PATENT AND TRADEMARK OFFICE
CERTIFICATE OF CORRECTION

PATENT NO. : 10,622,579 B2
APPLICATION NO. : 16/092215
DATED : April 14, 2020
INVENTOR(S) : Panfei Bao It is certified that error appears in the above-identified patent and that said Letters Patent is hereby corrected as shown below:

On the Title Page

Please add the following:
(30) Foreign Application Priority Data
"May 25, 2018 (CN) 201810512791.4"

Signed and Sealed this
Thirtieth Day of June, 2020

Andrei Iancu
*Director of the United States Patent and Trademark Office*